United States Patent [19]

Lemelson

[11] Patent Number: 5,628,881
[45] Date of Patent: May 13, 1997

[54] HIGH TEMPERATURE REACTION METHOD

[76] Inventor: Jerome H. Lemelson, 868 Tyner Way, Incline Village, Nev. 89450

[21] Appl. No.: 472,680

[22] Filed: Jun. 7, 1995

Related U.S. Application Data

[63] Continuation of Ser. No. 849,297, Mar. 10, 1992, Pat. No. 5,552,675, which is a continuation-in-part of Ser. No. 696,747, May 7, 1991, Pat. No. 5,131,941, Ser. No. 376,378, Jul. 7, 1989, Pat. No. 5,039,836, and Ser. No. 921,268, Oct. 21, 1986, Pat. No. 4,853,514, and a continuation of Ser. No. 643,883, Aug. 24, 1984, abandoned, which is a continuation of Ser. No. 571,188, Apr. 24, 1975, abandoned, and Ser. No. 163,203, Jul. 16, 1971, abandoned, which is a continuation of Ser. No. 849,013, Aug. 11, 1969, abandoned, and Ser. No. 422,875, Nov. 25, 1964, Pat. No. 3,461,347, which is a continuation-in-part of Ser. No. 710,517, Mar. 5, 1964, abandoned.

[51] Int. Cl.$^6$ ............................................. C01B 3/00
[52] U.S. Cl. ............................................... 204/164
[58] Field of Search ................................ 204/164, 168, 204/173

[56] References Cited

U.S. PATENT DOCUMENTS

| | | | |
|---|---|---|---|
| 1,700,675 | 1/1929 | Goddard | 126/680 |
| 1,957,541 | 5/1934 | Johnson | 123/143 |
| 2,137,598 | 11/1938 | Vos | 102/29 |
| 2,423,729 | 7/1947 | Ruhle | 219/19 |
| 2,527,747 | 10/1950 | Lewis et al. | 118/723 EB |
| 2,746,420 | 5/1956 | Steigerwald | 118/8 |
| 2,771,568 | 11/1956 | Steigerwald | 315/31 |
| 2,778,926 | 1/1957 | Schneider | 219/117 |
| 2,787,564 | 4/1957 | Schockley | 148/1.5 |
| 2,793,282 | 5/1957 | Steigerwald | 219/69 |
| 2,796,734 | 6/1957 | Bodine | 60/39.77 |
| 2,796,735 | 6/1957 | Bodine | 60/39.77 |
| 2,816,847 | 12/1957 | Shockley | 437/17 |
| 2,869,825 | 1/1959 | Crawford | 255/1.8 |
| 2,923,590 | 2/1960 | Lorenz | 346/110 |
| 2,932,588 | 4/1960 | Frank | 118/723 EB |
| 2,960,457 | 11/1960 | Kuhlman | 118/723 EB |

(List continued on next page.)

FOREIGN PATENT DOCUMENTS

246797  4/1962  Australia .

OTHER PUBLICATIONS

"Electronic Micrometer for Thin Material," *Electronics*, pp. 190, 194, 198 (vol. 19, Oct. 1946).

"Changes In Communication," *Science News Letter*, p. 102 (Feb. 16, 1957).

(List continued on next page.)

*Primary Examiner*—Kathryn Gorgos
*Assistant Examiner*—Kishor Mayekar
*Attorney, Agent, or Firm*—Niro, Scavone, Haller & Niro

[57] ABSTRACT

A high temperature reaction apparatus for reacting on solid, liquid and gaseous materials to change their state and/or chemical compositions. High temperatures are generated within a reaction chamber by means of electrical energy applied to electrodes or other means for generating radiant energy. The radiant energy may be in one or more forms such as a beam or a plasma. In a preferred form, the apparatus is controlled by a master controller such as a computer which generates control signals applied to control the admission of a reaction material or materials to a reaction chamber, the operation of one or more electrical energy to radiant energy generating means and, in certain arrangements, the removal or products of the high temperature reaction from the reaction chamber. Controlled chemical and/or physical reactions may thus be effected under computer control to perform such functions as incineration, the production of select chemicals, the refining of metals, the comminuting of solids, the vaporization of solid materials or select portions thereof, the production of select gases from vapors and solid materials and the coating of surfaces by particulate and/or vapor deposition. The apparatus may also be operated to provide combinations of such processes in a single reaction chamber or in a series of chambers joined together for the sequential and continuous processing of solid, liquid, vaporous and/or gaseous matter fed per se or as a mixture or separate streams thereof.

6 Claims, 3 Drawing Sheets

U.S. PATENT DOCUMENTS

| | | | |
|---|---|---|---|
| 2,968,723 | 1/1961 | Steigerwald | 250/49.5 |
| 2,984,307 | 5/1961 | Barnes | 175/2 |
| 2,987,610 | 6/1961 | Steigerwald | 219/117 |
| 2,988,237 | 6/1961 | Devol, Jr. | 214/11 |
| 2,989,614 | 6/1961 | Steigerwald | 219/50 |
| 2,994,801 | 8/1961 | Hanks | 315/14 |
| 3,009,050 | 11/1961 | Steigerwald | 219/69 |
| 3,016,449 | 1/1962 | Steigerwald | 19/117 |
| 3,020,389 | 2/1962 | Gorman | 219/72 |
| 3,033,974 | 5/1962 | Schleich et al. | 219/117 |
| 3,056,881 | 10/1962 | Schwarz | 219/121.15 |
| 3,067,572 | 12/1962 | Baumgartner | 60/25 |
| 3,087,211 | 4/1963 | Howe | 22/57.2 |
| 3,112,850 | 12/1963 | Garibotti | 225/2 |
| 3,117,022 | 1/1964 | Bronson et al. | 117/212 |
| 3,118,050 | 1/1964 | Hetherington | 219/117 |
| 3,119,707 | 1/1964 | Christy | 117/37 |
| 3,134,010 | 5/1964 | Bettermann et al. | 29/69 |
| 3,139,552 | 6/1964 | Brewer | 313/83 |
| 3,140,379 | 7/1964 | Schleich et al. | 219/69 |
| 3,154,371 | 10/1964 | Johnson | 346/108 |
| 3,163,743 | 12/1964 | Wroth et al. | 219/137 |
| 3,165,619 | 1/1965 | Cohen | 219/121 |
| 3,169,892 | 2/1965 | Lemelson | 148/6.3 |
| 3,173,175 | 3/1965 | Lemelson | 18/26 |
| 3,177,651 | 4/1965 | Lawrence | 60/35.3 |
| 3,192,318 | 6/1965 | Schleich et al. | 178/6.8 |
| 3,204,087 | 8/1965 | Millis, Jr. | 235/151 |
| 3,205,087 | 9/1965 | Allen | 219/121.15 |
| 3,206,336 | 9/1965 | Hora | 148/1.5 |
| 3,234,044 | 2/1966 | Andes et al. | 117/212 |
| 3,242,339 | 3/1966 | Lee | 250/203 |
| 3,244,412 | 4/1966 | Robinson et al. | 263/40 |
| 3,259,730 | 7/1966 | Wehde et al. | 219/69 |
| 3,267,250 | 8/1966 | Ullery, Jr. | 219/121 |
| 3,272,347 | 9/1966 | Lemelson | 214/1 |
| 3,276,902 | 10/1966 | Abraham | 117/106 |
| 3,282,100 | 11/1966 | Baiter | 73/190 |
| 3,291,959 | 12/1966 | Schleich et al. | 219/121 |
| 3,293,587 | 12/1966 | Robinson | 338/300 |
| 3,296,795 | 1/1967 | Nielsen | 60/39.82 |
| 3,301,949 | 1/1967 | Ullery | 178/6.8 |
| 3,303,319 | 2/1967 | Steigerwald | 219/121 |
| 3,308,264 | 3/1967 | Ullery, Jr. | 219/121 |
| 3,315,110 | 4/1967 | Wang | 313/84 |
| 3,326,176 | 6/1967 | Sibley | 118/6 |
| 3,330,696 | 7/1967 | Ullery, Jr. | 117/212 |
| 3,340,601 | 9/1967 | Garibotti | 29/582 |
| 3,360,398 | 12/1967 | Garibotti | 117/212 |
| 3,364,087 | 1/1968 | Solomon et al. | 156/4 |
| 3,371,404 | 3/1968 | Lemelson | 29/421 |
| 3,381,157 | 4/1968 | Ferreia | 313/348 |
| 3,386,857 | 6/1968 | Steinmaier | 117/212 |
| 3,388,314 | 6/1968 | Gould | 321/69 |
| 3,388,461 | 6/1968 | Lins | 29/610 |
| 3,398,537 | 8/1968 | Picquendar | 60/254 |
| 3,401,249 | 9/1968 | Schleich et al. | 219/69 |
| 3,402,278 | 9/1968 | Dernbach | 219/69 |
| 3,404,254 | 10/1968 | Jones | 219/121 |
| 3,422,246 | 1/1969 | Wetzel | 219/121 |
| 3,426,174 | 2/1969 | Graham et al. | 219/121 |
| 3,427,118 | 2/1969 | Andress et al. | 431/258 |
| 3,443,087 | 5/1969 | Robieux et al. | 250/41.9 |
| 3,448,280 | 6/1969 | Blitchington et al. | 250/227 |
| 3,461,347 | 8/1969 | Lemelson | 317/101 |
| 3,473,879 | 10/1969 | Berberich | 431/1 |
| 3,504,063 | 3/1970 | Lemelson | 264/24 |
| 3,513,285 | 5/1970 | Imura | 219/121 |
| 3,515,932 | 6/1970 | King | 313/339 |
| 3,535,488 | 10/1970 | Kitchin | 219/121 |
| 3,538,919 | 11/1970 | Meyer | 128/398 |
| 3,562,141 | 2/1971 | Morley | 204/298 |
| 3,569,660 | 3/1971 | Houldcroft | 219/121 |
| 3,699,334 | 10/1972 | Cohen et al. | 250/49.5 |
| 3,749,878 | 7/1973 | Sullivan et al. | 219/121 L |
| 4,207,154 | 6/1980 | Lemelson | 204/157.1 S |
| 4,655,146 | 4/1987 | Lemelson | 110/346 |
| 4,831,230 | 5/1989 | Lemelson | 219/121.12 |
| 4,853,514 | 8/1989 | Lemelson | 219/121.12 |
| 5,039,836 | 8/1991 | Lemelson | 219/121.13 |
| 5,064,989 | 11/1991 | Lemelson | 219/121.12 |
| 5,108,718 | 4/1992 | Dummersdorf et al. | 204/169 |
| 5,131,941 | 7/1992 | Lemelson | 75/10.19 |
| 5,170,032 | 12/1992 | Lemelson | 219/121.15 |
| 5,231,259 | 7/1993 | Lemelson | 219/121.12 |
| 5,308,241 | 5/1994 | Lemelson | 219/121.13 |

OTHER PUBLICATIONS

"Microwave Unit May Improve Radar," *Aviation Week*, p. 67 (vol. 66, No. 7, Feb. 18, 1957).

"Maser Development Offers Wider Uses," *Aviation Week*, p. 37 (vol. 66, No. 18, May 6, 1957).

Damon, "Maser Shows Promise, Some Drawbacks," *Aviation Week*, pp. 76–77, 81–82, 87, 89 (vol. 67, No. 7, Aug. 19, 1957).

Damon, "Maser's Potential Rests on Further Work," *Aviation Week*, pp. 91–92, 96, 99, 101, 104 (vol. 67, No. 8, Aug. 26, 1957).

"Range of Radio Telescopes May Be Extended Ten Times," *Science Digest*, p. 19 (Mar. 1958).

"'Maser' Aids Astronomers," *Science News Letters*, p. 227 (Apr. 12, 1958).

"Foresee New Method of Transmitting Messages," *Science News Letter*, p. 281 (May 3, 1958).

Klass, "Boom Predicted For Molecular Amplifiers," *Aviation Week*, pp. 69, 71, 75–76 (vol. 69, No. 22, Dec. 1, 1958).

Schawlow et al., "Infrared And Optical Masers," *Physical Review*, pp. 1940–1949 (vol. 112, No. 6, Dec. 15, 1958).

Gordon, "The Maser," *Scientific American*, pp. 42–50 (vol. 199, No. 6, Dec. 1958).

"Maser Works in 'Heat,'" *Science News Letter*, p. 7 (Jan. 3, 1959).

"Amplify Light Beams," *Science News Letter*, p. 83 (Feb. 7, 1959).

Glenn, "Thermoplastic Recording," *Journal of Applied Physics*, pp. 1870–1873 (vol. 30, No. 12, Dec. 1959).

Miller, "Optical Systems Have Space Potential," *Aviation Week*, pp. 87, 89, 91 (vol. 71, No. 24, Dec. 14, 1959).

Zuckerman, "'Cat Eye' Turns Night Into Day," *Popular Mechanics*, pp. 100–103, 218 (Dec. 1959).

Miller, "Low Temperature Coils Cut Maser Size," *Aviation Week*, pp. 76–77 (vol. 72, No. 7, Feb. 15, 1960).

"Synthetic Ruby Does New Tricks With Light," *Business Week*, p. 102 (Jul. 16, 1960).

Miller, "Optical Maser May Aid Space Avionics," *Aviation Week*, pp. 96–97 (vol. 73, No. 3, Jul. 18, 1960).

"Light Amplifier Operated," *Science News Letter*, p. 53 (Jul. 23, 1960).

"Stimulated Optical Radiation In Ruby," *Nature*, pp. 493–494 (vol. 187, No. 4736, Aug. 6, 1960).

"The Laser: A Light Amplifier," *Electronics World*, p. 39 (vol. 64, No. 3, Sep. 1960).

"Maser Transmits 25 Miles," *Science New Letter*, p. 245 (Oct. 15, 1960).

"Fantastic Red Spot," *Time*, pp. 47–48 (Oct. 17, 1960).

Klass, "Optical Maser's Space Potential Probed," *Aviation Week*, pp. 75, 77, 79 (vol. 73, No. 17, Oct. 24, 1960).

"Create Light Source Brighter Than Sun's Center," *Science Digest*, pp. 89–91 (vol. 48, No. 4, Oct. 1960).

"Light–Beam Amplifier," *Sky and Telescope*, p. 203 (vol. XX, No. 4, Oct. 1960).

"Ruby That Amplifies Light," *Popular Science*, pp. 25–26 (Oct. 1960).

Grace et al., "the Maser: Receiver for Signals from Space," *Electronic World*, pp. 35–38, 120–1 (vol. 64, No. 4, Nov. 1960).

"Optical Masers Made With Calcium Fluoride," *Aviation Week*, p. 73 (vol. 73, No. 26, Dec. 26, 1960).

"Uranium Optical Maser," *Science News Letter*, p. 434 (Dec. 31, 1960).

Deitchman et al., "Optical Maser," *Scientific American*, pp. 80, 82 (vol. 203, No. 6, Dec. 1960).

"Maser That Does Everything," *Business Week*, p. 20 (Feb. 4, 1961).

"Continuous–Output Optical Maser Demonstrated by Bell Laboratories," *Aviation Week*, p. 34 (vol. 74, No. 6, Feb. 6, 1961).

"Gaseous Laser Holds Vast Promise," *Missiles and Rockets*, pp. 38–39 (vol. 8, No. 7, Feb. 13, 1961).

Gilmore,"Introducing the Laser: Brightest Light in Electronics' Future," *Popular Electronics*, pp. 50–53, 112–113 (vol. 14, No. 2, Feb. 1961).

LaFond, "Lasers For Intergalaxial Contact?," *Missiles and Rockets*, pp. 32–33 (vol. 8, No. 11, Mar. 13, 1961).

K.H. Steigerwald, "Electron Beam Milling," pp. 269–290 of R. Bakish, ed., *Proceedings of the Third Symposium on Electron Beam Processes* (Mar. 23–24, 1961).

LaFond, "Laser, Fiber Optics Technologies Join," *Missiles and Rockets*, pp.33–34, 45 (vol. 8, No. 19, May 8, 1961).

Schawlow, "Optical Masers," *Scientific American*, pp. 52–61 (vol. 204, No. 6, Jun. 1961).

O'Toole, "MASER: New Electronic Marvel," *Science Digest*, pp. 33–39 (Jun. 1961).

LaFond, "Laser Seen Replacing Radar In Space Navigation Within Decade," *Missiles and Rockets*, pp. 16–17 (vol. 9, No. 2, Jul. 10, 1961).

Klass, "Laser Challenges Radar for Space Use," *Aviation Week*, p. 71 (vol. 75, No. 4, Jul. 24, 1961).

Zaret et al., "Ocular Lesions Produced by an Optical Maser (Laser)," *Science*, p. 1525 (vol. 134, No. 3489, Nov. 10, 1961).

Solon et al., "Physiological Implications of Laser Beams," *Science*, pp. 1506–1508 (vol. 134, No. 3496, Nov. 10, 1961).

"Laser Gun Shoots Light Rays," *Business Week*, pp. 46–48 (Dec. 30, 1961).

DeGroat, *Metalworking Automation* (McGraw–Hill 1962).

Crawford, "Electron Beam Machining," chapter 11 of Bakish, ed., *Introduction to Electron Beam Technology* (John Wiley & Sons, Inc.) asserted published in 1962.

Bakish, "Introduction to Electron Beam Technology," Chapter 13, pp. 282–400 (John Wiley & Sons 1962).

Schwarz et al., "Electron, Ion, and Light Beam As Present and Future Material Working Tools," *Proceedings of the National Electronics Conference*, pp. 351, 365 (vol. XVIII, Oct. 8–10, 1962).

Schawlow, "Advances In Optical Masers," *Scientific American*, pp. 34–45 (vol. 209, No. 1, Jul. 1963).

Miller et al., "Electron Beam Manufacturing Techniques for Integral Device Interconnections," presented at Western Electronic Show and Convention (WESCON), San Francisco, California (Aug. 1963).

Miller et al., "Versatile Interconnection Packaging System for Integral Electronics using Electron Beam Techniques," Presented at National Electronics Conference, Chicago, Illinois, Oct. 1963.

Rischell et al., "Laser Welding for Microelectronic Interconnections," *Proceedings: 1964 Electronics Components Conference, Washington D.C.*, pp. 145–151 (May 5–7, 1964).

Garibotti et al., "Automation of Electron–Beam Process for Microelectronics," *First International Conference on Electron & Ion Beam Science & Technology*, pp. 293–336 (Bakish, ed. 1965) (asserted that Conference was on May 5, 1964).

Namba et al., "Automatic Control of Electron–Beam Micromachining," *First International Conference on Electron & Ion Beam Science & Technology*, pp. 264–282 (Bakish, ed. 1965) (asserted that Conference was on May 5, 1964).

R. Bakish et al., *Handbook of Electron Beam Welding*, 1964.

Garibotti et al., "The Micro–Circuit Module—A Versatile Interconnection Packaging System," *Microelectronics and Reliability*, pp. 41–53, vol. 4 (1965).

Namba et al., "Electron and Laser Beam Processing," *Japanese Journal of Applied Physics*, vol. 3, No. 9, pp. 536–545 (Sep. 1965).

Culver, "The Maser: A Molecular Amplifier for Microwave Radiation," *Science*, p. 810 (vol. 126, No. 3276) (*no date available).

van Ardenne et al., "A New Electron Beam Processing Plant for Thin Film Resistors with a Fundamental Equipment of the 80 kV–Type," pp. 841–856, *Metallurgical Society Conferences of Electron & Ion Beam Science & Technology*, vol. 2 (Bakish et al., Apr. 1966).

Lengyel, *Lasers*, John Wiley & Sons, pp. 100–115 (1971) no month available.

Miller et al., "Electron Beam Welding," pp. 1–23 (source and date unknown).

Schollhammer, "Electron Beam Joining Techniques for Electronic Packaging," pp. 386–430 (source and date unknown).

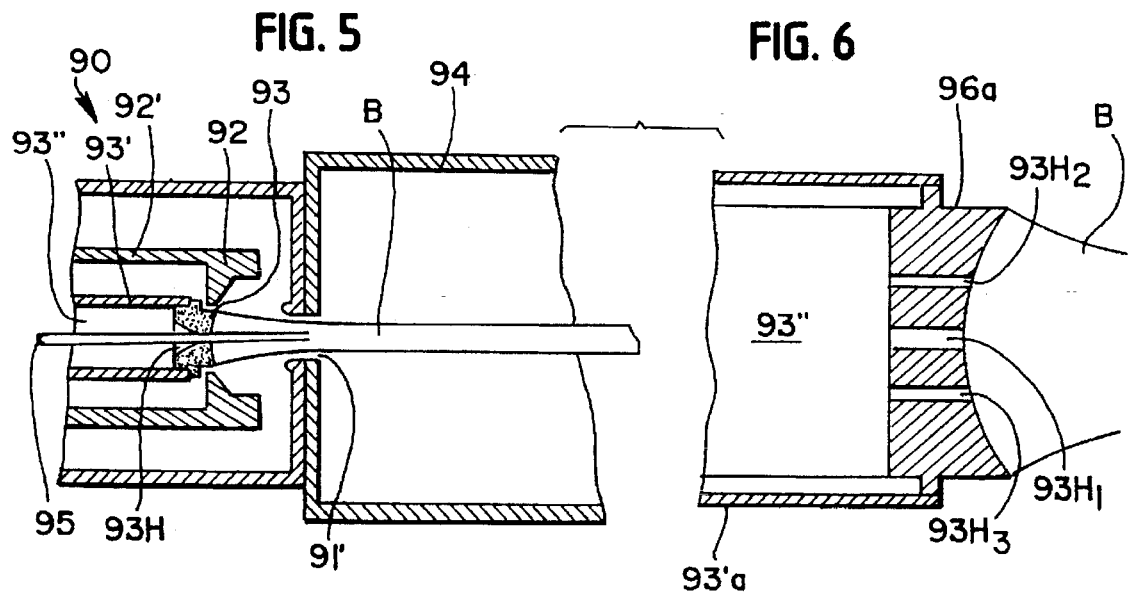
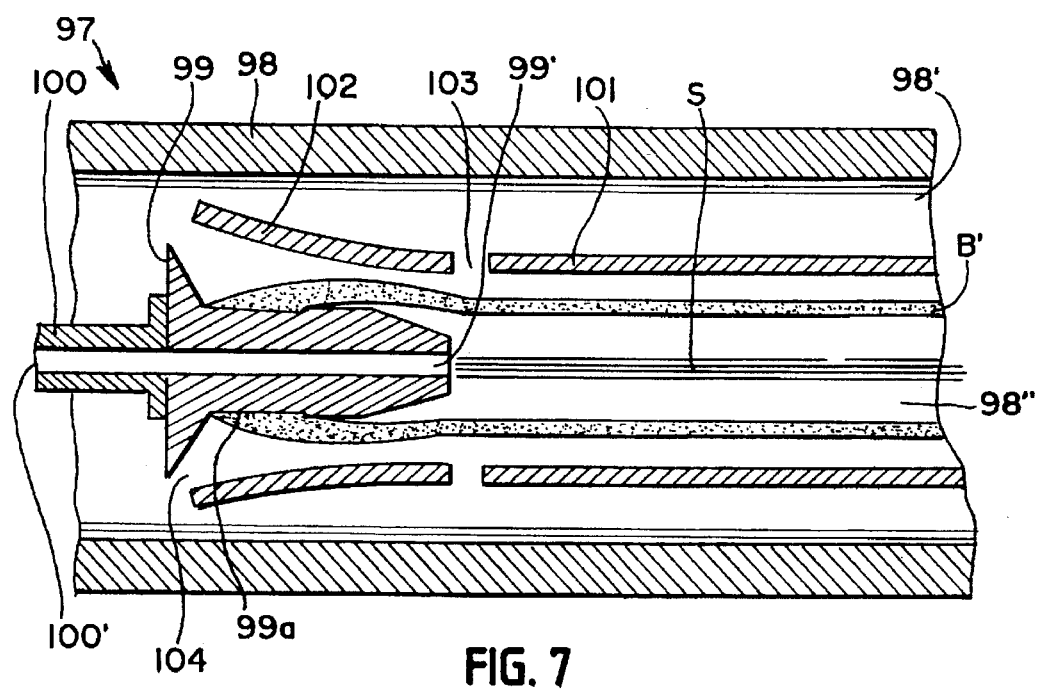

HIGH TEMPERATURE REACTION METHOD

CROSS REFERENCE TO RELATED APPLICATIONS

This is a continuation of application Ser. No. 849,297, filed Mar. 10, 1992 now U.S. Pat. No. 5,5522,675 which is a continuation-in-part of Ser. No. 07/696,747 filed May 7, 1991 now U.S. Pat. No. 5,131,941 as a continuation-in-part of Ser. No. 376,378 (filed Jul. 7, 1989) now U.S. Pat. No. 5,039,836, a continuation-in-part of Ser. No. 921,268 (Oct. 21, 1986) now U.S. Pat. No. 4,853,514, a continuation of Ser. No. 643,883 (Aug. 24, 1984) abandoned, which was a continuation of Ser. No. 571,188 (Apr. 24, 1975) abandoned, a continuation of application Ser. No. 163,203 (Jul. 16, 1971) abandoned, which was a continuation of Ser. No. 849,013 (Aug. 11, 1969) abandoned, as a continuation of Ser. No. 422,875 (Nov. 25, 1964), now U.S. Pat. No. 3,461,347 which was a continuation-in part of Ser. No. 710,517 (Mar. 5, 1964) abandoned.

SUMMARY OF THE INVENTION

This invention relates to an apparatus and method for reacting on matter by means of one or more forms of radiation. In a preferred form, the radiation generates and transfers sufficient energy to the matter to cause a physical and/or chemical reaction such as by pyrolosis or electropyrolosis of select atoms of said matter to change its molecular structure or to separate select atoms from molecules thereof by breaking the bonds between such atoms and other atoms of such molecules. In one form, the method is carried out continuously with respect to matter such as commin-uted metal containing ore, reaction or waste gas, water vapor per se or mixed with gas molecules or solid particles of a catalyst, hydrocarbon molecule containing gas or mixtures of gases and/or vapors containing molecules of matter to be heated and reacted on. In said preferred form, reactions take place at temperatures in the range of 1000 to 2000 degrees Centegrade; in one form in the range of about 1700 degrees centegrade to separate metal atoms from ore molecules containing same in comminuted particles of such ore which are continuously fed to a reaction zone in which is generated a plasma. Such process includes continuously forming such refined metal to shape by spray depositing same onto a moving substrate or a shaping means such as a continuous casting die, mold or rolling mill. Other high temperature reactions include the continuous formation of carbon or synthetic diamond particles or coatings on a moving substrate from carbon atoms stripped from molecules of a gas or vapor containing same. Other forms of the invention include the high temperature disassociation of hydrogen from oxygen atoms and the incineration or pyrolizing of products of combustion such as waste gases and solid particles therein, vaporized waste liquids and the like. The invention is also defined by improvements in apparatus and methods for generating high temperatures.

Accordingly it is a primary object of this invention to provide an apparatus and method for processing matter by means of high temperature radiation.

Another object is to provide an apparatus and method for reacting on matter with radiation generated in a plasma.

Another object is to provide an apparatus and method for reacting on matter with radiation generated by a plurality of plasmas.

Another object is to provide an apparatus and method for reacting on matter with radiation generated by a plurality of different radiation generating means.

Another object is to provide an apparatus and method for reacting on matter with radiation operable to heat molecules of such matter to a temperature sufficient to break the bonds the atoms of such molecules and permit the selective separation of such atoms wherein such apparatus and method includes continuously collecting and forming selected of such atoms, such as metal atoms derived from ore containing same, to shape.

Another object is to provide an apparatus and method for reacting on matter defined by carbon atom containing molecules with high temperature radiation operable to separate such carbon atoms from their molecules and to deposited and form same on a substrate into a synthetic diamond form of such carbon.

Another object is to provide a high temperature reaction apparatus and method for generating a plurality of plasmas.

Another object is to provide and apparatus and method for generating a plasma by means of multiple forms of radiation.

Another object is to provide an apparatus and method for pyrolizing waste material such as waste products of combustion in furnaces and internal combustion engines.

With the above and such other objects in view as may hereinafter for fully appear, the invention consists of toe novel constructions, combinations and arrangements of parts as will be more fully described and illustrated in the accompanying drawings, but it is to be understood that changes, variations and modifications may be resorted to which fall within the scope of the invention as claimed.

BRIEF DESCRIPTION OF THE DRAWINGS

FIG. 5 is a sectioned side view of a hollow beam generating apparatus applicable to the apparatus of FIG. 1;

FIG. 6 is a sectioned side view of a modified form of the apparatus shown in FIG. 5;

FIG. 7 is a cross sectional view of another form of hollow beam apparatus applicable to the apparatus of FIG. 1;

DESCRIPTION OF THE PREFERRED EMBODIMENTS

Figure 1:
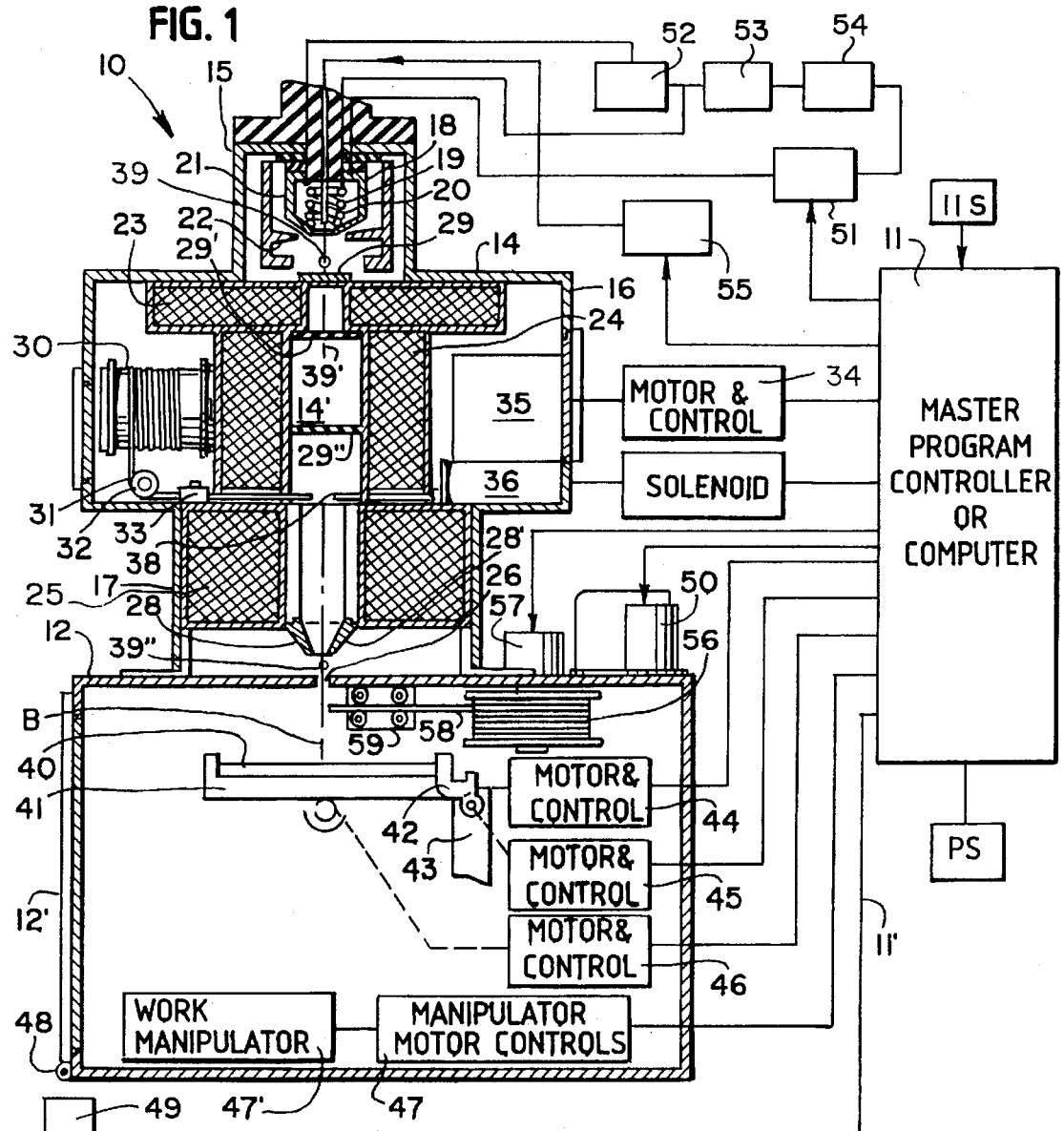
FIG. 1 is a side view with parts broken away for clarity of an electron beam apparatus for generating high temperature beam radiation for reacting on matter fed to or intersected. by the radiation beam thereof.

Referring now to the drawings, FIG. 1 illustrates an electron beam apparatus 10 which may be operated to perform a plurality of different functions including the selective deposition of one or more materials onto a substrate and/or the selective erosion or machining of said substrate. The apparatus 10 is composed of a chamber 12 containing work to be processed by an electron beam B which is generated within and directed through a chamber 14 disposed on top of the chamber 12 communicating with said chamber 12 by means of a small opening 26 in the upper wall of chamber 12. Disposed at the upper end of chamber 14 in a housing 15 is an electron beam generating assembly 18 which includes a filament 19 surrounding a rod-like cathode 20. The rod-shaped emitter 20 is indirectly heated by the filament 19 and generates an electron beam when a suitable source of high voltage 55 is connected to the emitter 19. Surrounding the described elements is a heat shield 21 and disposed directly beneath and adjacent the heat shield is a grid 22. Suitable filament supply, bombardment supply and grid supply means denoted 52, 53 and 54 are provided and connected to the respective elements of the emission assembly 18 for generating a suitable electron beam which is directed through a small opening in an anode plate 29, thence into an elongated passageway 14' which is shown surrounded by electro-magnetic coils denoted 23, 24 and 25, the purpose of which will be described. Plates 29, 29' and 29" contain collimating slits for the beam B.

At the end of passageway 14', the beam passes a pair of focusing pole pieces 28 and 28' which serve to focus the beam through an opening 26 in the upper wall of chamber 12 against a selected area of a work piece 40 disposed in alignment with said opening.

The hereinabove described electron beam apparatus may be modified or supplemented with features found in known electron gun apparatus such as provided, for example, in U.S. Pat. Nos. 2,944,172 and 3,009,050 and in the the "The Focusing of Charged Particles" edited by Albert Septier.

The work piece 40 is shown as a flat substrate such as a sheet or plate of metal or insulating material such as ceramic or plastic and may comprise an electronic circuit board or other device on which it is desired to perform operations of selectively adding material thereto and/or eroding or removing material therefrom. The substrate 40 is shown secured to a fixture or table 41 which is operative to move at least in two directions by predeterminately controlling respective motors 44 and 46 so as to locate any particular area of the substrate 40 in direct alignment witch the opening 26 and the beam passed therethrough to permit preprogrammed operations of said beam on said substrate. A solenoid or motor 45, when controllably. operated, actuates a clamp 42 which operates to secure the work piece 40 on the fixture 41 or release same so that it may be removed from said fixture. The support 41 is movably mounted respect to a base 43 and is prefereably positionally controlled by respective lead screws driven by the motors 44 and 46 in accordance with the manner of conventionally positioning a work table with respect to a machine tool. Notation 47 refers to one or more motors and controls therefore for operating an automatic manipulator 47' located either within or exterior of the chamber 12 and operative to remove individual units of work from the table 41 and to replace same with new work to be processed in synchcronization with the operation of the motor 45 operating the clamp 42. A door 12' is opened and closed by means of a motor 49 operating a suitable cam mechanism 48 at the door hinge to permit work to be inserted into and removed from chamber 12.

While the described electron beam generating means does not ordinarily require vacuum to generate and direct the electron beam against the work, a vacuum pump 50 is illustrated in FIG. 1 and is operatively connected to chamber 12 in the event that certain types of operations require that the work, during bombardment by the beam, be provided in a vacuum.

A master controller 11, such as an adjustable multi-circuit, self-recycling timer or other form of program controller or computer, is provided having a plurality of outputs 11' on which are generated respective command control signals for controlling all of the described motors and other servos as well as those which will be described hereafter, so that the apparatus 10 may be operated in a preprogramed manner which includes the replacement of work previously processed with new work suitably aligned on the fixture or table 41, the predetermined location and subsequent movement of said table to bring different areas thereof in alignment with the beam, the programmed operation of the beam and, as will be described hereafter, the programmed admission of one or more materials to the electron beam to permit their selective deposition onto selected areas of the surface of work piece 40 for the construction of electrical circuits, the selective contouring of plates, or the selective coating of articles.

Materials to be deposited onto the surface of the substrate 40 may be admitted to the immediate vicinity of chamber 12 or at a plurality of points along the path of travel of the electron beam. Said material may be in the form of a solid rod or wire which is directed into the electron beam and melted or vaporized thereby and carried along or within said beam to the area of the surface of the substrate intersected by said beam so as to be deposited thereon or diffused into the outer stratum of said substrate. The manner in which the material is deposited or diffused will be a function of the intensity of the beam which may be a constant potential or variable in accordance with command control signals generated by the master controller 11. Accordingly, notation 55 refers to a source of high potential energy connected to the rod cathode. In certain instances, it may be desirable to provide an electronic or motor operated means within the unit 55 for varying the potential output thereof in accordance with a variable command control signal generated on the input thereto by the master controller 11. Suitable means for varying the voltages applied to the filament and grid located in blocks 52 and 54 may also be provided which are varied in accordance with signals generated by the master controller 11. Accordingly, by such means, the potential and characteristics of the beam as it passes through the opening in anode 29 in the chamber 14', may be predeterminately varied in accordance with the operation to be performed thereby.

Notations 39, 39' and 39" refer to respective conduits in the form of small diameter tubes extending into the chambers 15, 16 and 17 which respectively surround the beam emitter, the elongated passageway 14' and the focusing pole pieces 28 and 28'. Respective solenoid operated valves or pumps controlled by signals generated by master controller 11 may be utilized to admit predetermined quantities of selected gases, vapors, liquids and/or powdered materials through the conduits 39, and 39" to be ejected from the open ends thereof into the electron beam and to be carried along the beam through the opening 26 against the surface of the work piece 40 intersected by the beam B.

The potential and movement of electrons or particles within the beam B may be sufficient to carry particles or droplets of material admitted to the beam along the beam to the surface of the work piece. However, auxiliary means are also provided in FIG. 1 to confine the material admitted to the beam to the vicinity of the beam and, in certain instances, to induce its movement along the beam toward the work. Such means includes a plurality of electro-magnetic coils 23, 24 and 25 disposed along the passageway 14' which coils are energized in a manner to magnetically confine the particles to the vicinity of the beam and, in certain instances, to induce movement of the particles along the beam towards the work. The coil 25 may also serve to assist in focusing the beam through the focusing pole pieces 28, 28' so as to be focused at a fine point when it intersects a surface of the work.

Shown disposed within the intermediate chamber is a coil 30 containing a wire 31 of material to be deposited, such as metal, which wire is guided about a plurality of rollers 32 and a pair of rollers 33 through a passageway between the coils 24 and 25 into chamber 14'. The rollers 33 are power operated by a motor (not shown) which is controlled by a motor controller 34 operated by a signal generated by the master controller 11. Thus, by properly programming master controller 11 to generate a signal which is passed to controller 34, the rate of travel of wire 31, as well as the timing of its admission to the beam B, may be predeterminately controlled so that predetermined quantities of the material of said wire may be vaporized and directed along the beam to be deposited onto the surface of the work piece in accordance with the predetermined operation of the beam and positioning of the work piece so that material may be predeterminerely deposited onto select areas of th work piece.

Notation 35 refers to a reservoir of particulate material located within the intermediate chamber 16 which is fed by means of a conveyor or motorized pump 36 through a tube 38 extending therefrom. A controller 37 receiving command control signals from the master controller 11 is connected to the motor operating the pump or conveyor 36 so that predetermined quantities of said partculate material may be fed or directed on a gas stream into chamber 14' and the beam generated therein.

A second coil 56 of metal or other suitable material provided as a wire 58 is located within chamber 12 and is rotationally mounted off the upper wall thereof and driven by a motor 57 controlled by a signal generated by the master controller 11. The wire 58 is fed between powered rolls of a guide 59 which is driven by a motor (not shown) which is also controlled by a signal or signals generated by the master controller 11. The operation of the motor operating the vacuum pump 50 may also be controlled by the master controller 11 so as to predetermine a complete cycle of operation utilizing said vacuum pump.

It is noted that wire, particulate material, liquid or gaseous streams of matter may also be directed into the electron beam B at any of the locations where tubes 39, 39' and 39" enter the chambers 15 and 16.

The wires 31 and 58 may comprise various polymers, semi-conductors or ceramics, metals or alloys. Where said wires or rods are made of conducting material such as metal, they are preferably electrically insulated from the housing and are not grounded in a manner which would ordinarily cause the beam B to discharge to ground. Similarly, all tubes 39, 39', 39", 38, etc. feeding fluent material to the beam are also prefereably either made of electrical insulating material or are insulated from ground.

It is noted that the apparatus of FIG. 1 may be subject to a number of design variations and may include, for example, the provision of an endless conveyor for continuously or intermittently feeding work to be processed by the beam past the opening 26. The apparatus 10 may also be modified to permit movement of the beam housing 14 in one or more directions with respect to a large work piece and to control the location thereof with respect to selected work pieces for performing beam erosion and/or deposition operations as described. Operation of the means for energizing the electromagnetic coils 23, 24, and 25 for generating suitable magnetic fields An the vicinity of the beam to control its direction, focusing and to confine or control the flow of material admitted there to, as described, may also be under, the control of the master controller 11.

Further modifications to the apparatus of FIG. 1 include the provision of additional electrode means for generating a plurality of beams and directing same against one or a plurality of different areas of a work piece to simultaneously perform operations of the type described. For example, one beam may be operated to erode a selected area of a work piece while a second beam may be operated to selectively deposit material on another area of a work piece to both excavate and/or build up material on said work piece or to fill in areas which have been previously eroded. By simultaneously operating a plurality of beams to simultaneously deposit and/or erode material from the work piece surface, the time required to fabricate devices such as electronic circuits may be substantially reduced.

By providing means in chamber 12 for disposing lead wires against selected portions of a substrate such as an electrical circuit, one or more beans may be used to weld said to the substrate by melting a metal of the wire and/or depositing a weld material against the wire and substrate by means as described.

Thin or thick metal films may be deposited onto a substrate by admitting metal to the beam by one or more of the means described, as the substrate and/or beam means are moved or deflection controlled so as to form electrical circuit lines or leads on the substrate. Semi-conducting, polyconducting or insulating materials may be selectively deposited on a substrate to form various electrical circuit components providing, for example, integrated circuits and the like.

Figure 2:
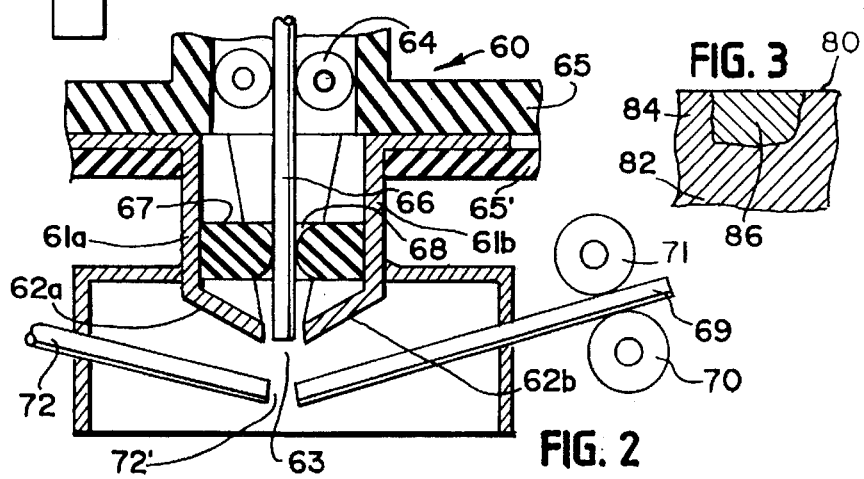
FIG. 2 is a side view of an electrode applicable to apparatus of the invention.

In FIG. 2 is shown a modified form of electron emitter and beam forming apparatus applicable to the apparatus of FIG. 1 The beam emitter assembly 60 is composed of opposed electrode portions 61a and 62b terminating at the end of the electrode and opening 63 therebetween through which material to be vaporized and carried by the beam may be fed. The electrodes may be made of suitable high temperature conducting material such as tungsten or other high temperature metal and are supported by insulating gasket plates 65 and 65'.

A first material 66 in the form of a rod or tube extends through the center of the electrodes 61a and 6lb and is downwardly fed by means of u pair of powered rollers 64 operated by motor (not shown) which is preferably predeterminately controlled to control the feed, speed and ,timing of the drive of consumable member 66 in accordance with the operation of the computer or master controller as described. A guide 67 in the form of a plug of insulating material having an opening 68 therein receives rod 66 and guides it to the end of the conical head of the electrodes 61a and 61b. Suitable means, as described above, may be provided to heat the electrodes and the end of rod 66 a sufficient degree to cause said rod end to melt or vaporize within the beam generated by the electrodes. If the potential generator across the electrodes is of a sufficient intensity, the material melted or vaporized from the end of rod 66 will be carried along the beam towards the work as described.

The consumable electrode 66 may also comprise a hollow tube containing gaseous, liquid, vaporous or powdered material fed to the open end thereof to be dispensed into the zone in which the beam is generated.

Also illustrated in FIG. 2 is a rod 69 fed between powered rollers 70 and 71 to beneath the end of the conical electrodes 61a and 61b so as to be admitted to the vicinity thereof in which the intense beam is generated for melting or vaporizing the material of said rod.

A tube 72 is also shown in FIG. 2 which is connected to a source of fluent material such as described and having its open end 72' disposed immediately beneath the electrodes 61a and 61b so as to admit fluent material to the beam so generated for the purposes described.

While a source of electrical energy PS is shown in FIG. 1 as being operatively connected for operation of the master program controller or computer 11 which power supply may generate the electrical energy necessary to activate the controls or operate the various motors and servos of the apparatus 10, it is assumed that suitable power supplies are provided to operate all the described components such as the magnetic coils, the high voltage power supply 55, the filament supply 52, the bombardment and grid supplies 53 and 54 as well as the described material feed means and work positioning servos.

Figures 3, 4:
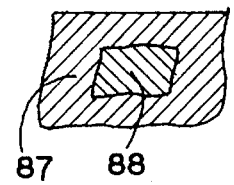
FIG. 3 is a side view in cross section of one form of solid structure producible by an apparatus of the type shown in FIG. 1.
FIG. 4 is a side view of a modified form of structure of the type shown in FIG. 3.

There is shown in FIG. 3 a structure in a work member which has been subjected to beam deposition operation of the type described. The work member 80 is composed of a base 82 having an upper stratum 84 composed of material deposited thereon such as semi-conducting material, metal or insulating material. Notation 86 refers to a domain of material other than that forming stratum 84 which has been beam deposited in an opening or cavity provided in 84 by the electron or intense laser beam or beams described. The material of which domain 86 is composed may comprise any suitable metal, semi-conducting materials or insulating material having characteristics which are different than those of the material defining layer 84 and may be utilizeld, for example, to form part of an active element of a semiconductor device, an insulating or isolating element or adjacent to or surrounding an active element or a conducting element disposed in cooperative relationship to other materials; (not shown) similarly deposited on or within the stratum 84.

In FIG. 4, a domain 88 ff material is shown completely surrounded by a stratum 87 of material which has been deposited simultaneously and/or after the deposition of the material comprising domain 88.

Circuit conducting strip elements may also be similarly deposited along selected areas of a substrate or material deposited on a substrate to form various electrical devices and circuits. The substrate may comprise, in addition to various flat ceramic, glass or plastic materials, chips of silicon and other materials, crystals, filaments, wires, rods, foil other electrical components and devices such as semiconductors, integrated circuit assemblies and components, polyconducting layers, metal films, etc. In addition to depositing conducting and semi-conducting components as circuit elements, the means described herein may be used to deposit doping materials and isolating oxide materials, polyconducting materials, etc. on circuit members.

FIGS. 5 to 7 illustrate features of apparatus for forming hollow or tubular electron beams and for feeding one or more materials to the interiors of said hollow beams to be carried therewith and deposited on a substrate intersected by the beams or to cooperate with the beams in operating on the substrate. Features of the apparatus illustrated in FIGS. 5 to 7 may be applied to the apparatus of FIG. 1 or other suitable apparatus as described herein for performing various operations on solids, liquids, gases or matter in the plasma state. By "hollow or tubular electron beams" is meant electron beams which have the configuration of an elongated tube having a hollow interior or core which is not occupied by the radiation beam.

In FIG. 5, an electron beam generating apparatus 90 includes a first housing 91 in which is disposed an anode 92 attached to a mount 92'. A cathode head 93 is centrally disposed within the anode mount by means of its own mount 93' and faces an opening 91' in the housing 91 which extends through an opening in a second housing 94 which may extend to or be the equivalent of housing 16 of FIG. 1. The cathode head 93 when properly energized by a suitable source of high voltage electrical energy, is operative to generate a hollow electron beam B which converges as it passes through the opening 91' and is directed by suitable control and focusing means (not shown) out of an opening in housing 94 to the surface of a work piece such as a substrate or into a spacial volume beyond housing 94 containing gaseous or liquid matter to be reacted on by the beam. The cathode 93 contains an opening 93H therethrough, through which opening matter may be directed to the interior of the hollow beam B. Said matter may be in the form of a solid rod or wire, particulate material carried on an airstream or other fluid carrier directed through the interior volume 93" of the housing 93' and/or a gas or vapor flowed under pressure into the volume 93" and directed at suitable velocity through the opening 93H to the interior of the hollow beam B. In FIG. 5, notation 95 refers to a rod which is driven by wheel drive means as described which is operated by a controlled motor, preferably under the control of a master controller of the type shown FIG. 1. The rod 95 may be driven completely along the center of the hollow beam B to the surface of the work piece at which surface it may be melted by heat transferred directly thereto by the beam B and/or the work piece itself intersected by the beam for coating, diffusing or otherwise depositing same onto the work piece. The rod 95 may also be vaporized by the intense heat of the beam B as said rod enters the narrowest portion of the beam and the resulting vaporized metal or other material defining the rod may be carried along the interior of the beam by flow induced by the beam itself, by gas directed along the center of the rod or adjacent thereto as it passes through the opening 93H in the cathode or by moving electro-magnetic fields generated by electro-magnets disposed around the housing 94 as described.

The apparatus of FIG. 5 may also be operated wherein gas under pressure is forced through the opening 93H which may be in the shape of a nozzle operative to direct said gas as a high-velocity stream along the center of the beam to the surface of the work piece. The gas, may be utilized per se in cooperation with the beam to effect such operations as cutting or severing portions of the work piece intersected by the beam and gas, creating a chemical reaction in which the gas effects a change in state of the work piece, boring or drilling a hole of predetermined shape and dimension through the work piece, moving material melted by the beam or rapidly oxidizing and vaporizing or volatizing material of the work piece for the purpose of removing or machining same. The gas may also Contain fine particles of solid or vaporized matter which is deposited on the work piece for any of the purposes described or may be used to erode or cause flow of the work ea described or may be injected into a gaseous or liquid material for creating a chemical reaction, effecting combustion to weld or rapidly heat the volume into which the beam is injected, create a plasma such as a plasma jet or generate thrust.

In FIG. 6, a modified form of the cathode of FIG. 5 is shown having a plurality of through and through openings therein through which openings may be injected, flowed or forced the same or different liquid, gaseous or solid materials. A mount 93' a for a concave cathode 96 is disposed as part of an electron beam apparatus of the type shown in FIG. 5 and is hollow, defining a passageway 93" through which a liquid, gas or plasma may be flowed out the openings 93H1, 93H2 and 93H3. The latter two openings are shown disposed radially outwardly of the axial opening 93H1. A plurality of additional openings may also be arrayed about the center opening 93H1.

In one form of the apparatus shown in FIG. 6, a solid rod or wire may be driven through the opening 93H1 while a gas or liquid may be admitted to the center of the beam B through the openings 93H2 and 93H3 after being forced through the passageway 93" behind the cathode. Solid material directed through the openings in the cathode may be vaporized as soon as or shortly after they enter the interior of the beam B by the high-intensity electrical energy applied to the cathode 96a.

In FIG. 7, an injection gun design is illustrated for initiating a hollow beam in a uniform magnetic field. The apparatus 97 includes an elongated cylindrical magnetic coil 98 surrounding a chamber 98' in which is supported, on a tubular mount 100, a cathode 99. A passageway 100' extends through the tubular mount 100 and may be utilized for directing a solid, liquid, gaseous and/or plasma material to a passageway 99; extending through the cathode 99. The cathode 99 has a conical cathode emitting surface 99a which is surrounded by a conical shaped anode 102. The beam B' emerges from the cathode emitting surface 99a and is directed by means of a uniform axial magnetic field generated by the magnetic coil 98 so as to form a tubular beam which is passed through a drift tube 101 in the direction of the work. A gas, vapor, plasma or gas containing particles, is forced through the passageway 100' and through the axial bore 99; extending through the cathode 99. It is ejected as a stream S through the center volume 98" of the beam B' and may be flowed as the result of its velocity and/or the force induced thereby by the magnetic field or the portion of a beam particles so as to be directed through the gun against the work volume or surface intersected by the beam B'.

It is noted that auxiliary fluid, such as gas, vapor, plasma particles or solid particles may be flowed between the head end of the anode 102 and the head of the cathode 99 through the annular opening 104 or through one or more openings 103 disposed between the anode 102 and the drift tube 101 so as to be carried between the outer surface of the beam B' and the drift tube in the direction of the work to be expelled from the end of the gun towards said work with the beam B'.

While the beam B' shown in FIG. 7 is illustrated as having a relatively thin wall, the volume 98" defining the interior of the beam which does not contain beam particles may be of relatively small diameter and in one instance, may be substantially equal to or smaller than the diameter of the bore 99' through the cathode 99 so that the gas, liquid or plasma injected through the cathode may be in contact with the beam 50 as to be carried thereby towards the work or so that a solid or wire fed through the openings 100' and 99' may be easily vaporized as it enters the hollow beam B' and the vapors thereof may be carried by the beam in the direct/on of the work.

In order to properly vaporize a solid rod or particles introduced into the interior volume 98" of the beam B, focusing magnetic coils may be applied downstream of the snout end of the cathode 99 to cause a pinch effect in the beam B' so as to converge the beam particles against the solid material directed into the interior of the beam for the purpose of vaporizing said material.

In a modified form of the apparatus hereinabove described, a solid rod of ion-forming material such as cesium may be directed through the annular passageway in the cathodes described or otherwise disposed along the cathode and the paramus may be operated in such a manner as to generate ions thereof for the purpose of effecting thrust, to effect propulsion of the apparatus such as rocket propulsion.

In the operation of the aparatus described, it is noted that the same beam employed to vaporize and effect deposition of material on a substrate may also be employed to erode selected portions of the substrate prior to or after material is deposited thereon. These distinct operations may be effected by program and/or adaptively controlling beam intensity, beam focus, relative movement of the beam and/or workpiece and the time the beam remains on the area being eroded so as to predetermine the depth of the cavity. Thus predeterminately contoured substrates may be formed by program controlling the above variables to erode and/or deposit material across the surface of the substrate. Electrical circuits composed of crystals or other devices having domains of different materials located at different depths therein may be so fabricated as well as prototype models or mold cavities having irregular shape.

Modified forms of the invention illustrated in FIGS. 1, 2, 5, 6 and 7 include the following embodiments:

(a) a plurality of different materials may be controllably fed simultaneously or sequentially into the intense radiation beam by predeterminately controlling the operation of respective motors or valves operative to admit said materials to the chamber and beam in a program controlled cycle determined by the operation of the master controller or computer 11 in open and/or closed loop cycles with or without the application of adaptive control thereto. Such plurality of materials may all be in the same or different states (i.e.—solid wire formations, flowed particles, liquid streams, gas or vapor stress or streams of charged particles such as plasma streams).

(b) The movement of electrons defining the beam may be utilized to induce the flow of the material in the beam to flow along the beam. In this connection, the particles of deposition material flowed to the beam or formed therein may be charged as they enter the beam or precharged prior to admission to the beam so that the combination of forces resulting from formation of the beam and its directional control means may be utilized to carry the deposition material particles along the beam towards the work. Auxiliary magnetic field coil means may be disposed along the beam to account for and direct deposition material around or within the beam towards the work. Said coils may be operative to generate static magnetic fields or moving magnetic fields which move in the direction of the beam to induce flow of the material admitted to the beam along the beam in the direction of the work.

c) An auxiliary gas stream such as a stream of inert gas or active gas, may be directed from a conduit along the electron beam to induce flow of particles of material admitted to the beam to cause said particles to intersect the area of the work intersected by the beam or the area immediately adjacent thereto. Said gas may be introduced at one or more locations along the path of travel of the beam and controlled in accordance with the quantity and characteristics of the material admitted to the beam.

(d) The flow of the hereinabove described materials along the beam may be effected by generating a plasma at least in part by the operation of the beam and/or auxiliary electrode means surrounding the electrode which operates to generate the beam by admitting suitable material to the vicinity of said electrodes. Said plasma may be flowed as a stream surrounding the beam by suitable magnetic field generating means such as one or more electro-magnets disposed adjacent to the beam along its path of travel. Such plasma, if generated at relatively high temperature, may also be operative to cooperate with the beam in heating the surface of the work.

(e) The illustrated and above described embodiments may all utilize one or more electron beams or one or more laser light beams generated at sufficient intensity to effect the desired described results. For example, solid wire or rod, particulate, vaporous, liquid or gaseous material may be introduced into the intense light beam generated by the laser disposed in the vicinity of the electrodes illustrated and may be vaporized thereby and carried along the laser beam towards the work by one or more of the means described. Particle charging or ionizing means may be provided in the vicinity of the laser or along the beam to form a plasma-like flow of material along the beam towards the work.

(f) A plurality of electron and/or laser beams may also be generated within the chamber and each predeterminately. directed to intersect a selected area or the same area of the surface of the work. One or more materials to be deposited onto the work may be introduced into each beam. One of the beams may be operative to erode preselected portions of the work substrate while one or more other beams may be operative to deposit selected amounts of material onto the substrate.

(g) The described bean or beams may be operated at sufficient intensity to not only vaporize or otherwise change the state of material admitted to the beam but also to cause the diffusion of said material into the substrate intersected by the beam after or properly heating that portion of the substrate receiving the fused material. In other words, the velocity of the beam particles may be operative to cause deposition particles carried thereby to be diffused into the surface stratum of the work intersected by the beam and deposition material.

(h) Since the cathode current density increases exponentially with temperature and since relatively high temperatures may be required to vaporize certain material to be deposited, to generate plasmas or to more rapidly machine the work by generating beams of relatively high voltage (above 20 kV), the intense radiant energy beam of a laser may be employed to heat the cathode and/or the material being fed to the electron beam or the surface of the work intersected by said beam. Said laser may be conveniently located within the chamber 12 or any of the compartments of the chamber 11. The laser may also be disposed exterior of the elctron gun housing with its beam directed through an opening or window thereto such as through the passageways 39, 39' or 39". The laser may also be supported on the shield 21, the mount for grid 22 or the insulation material supporting the cathode and may have its beam directed to intersect the cathode wire or rod 20 to supplement or replace the heating filament 19.

(i.) The intense radiation beam of a laser disposed within or directed through through the chambers 11 and/or 12 from the exterior thereof may be utilized to cooperate with the electron beam generated as described, in operating on work, such as in performing such operations as selectively heating, melting , vaporizing or otherwise affecting work or performing a plurality of such operations. In this connection, a single laser may be employed to perform a plurality of operations in cooperation with the electron gun, such as heating the cathode thereof and heating and vaporizing material to be deposited or implanted by the electron beam or a laser beam as described, heating the cathode and the work, generating a plasma and heating the work, vaporizing material of the work during or before material is deposited by the electron beam or laser beam or in the performance of the other operations described. Gaseous, vaporous and/or particulate matter may also be controllably flowed through the plasma or plasmas so generated to perform select chemical and/or physical reactions thereon prior to deposition or separation of the reaction products thereof. A single laser and/or electron beam may be split into a plurality of beams by suitable beam splitting means such as lenses, mirrors, or magnetic means. Such plural beams may be used to perform the same function such as heating, melting, cavitating, vaporizing, implanting, etc. on different portions of the work or different functions on the same or different portions of the work and to generate a plurality of plasmas at different select locations.

j) The described apparatus or variations thereof may perform controlled operations on or with respect to liquids, gases, vapors or plasmas into which beams and material(s) are directed within a chamber or within free space, to perform controlled chemical reactions, plasm generation, propulsion, burning and welding. Material or materials flowed or injected into, within or parallel to the laser or electron beam may be oxygen, an inert gas, a material to be added for alloying, doping or adding to the material being heated or otherwise operated on by the beam.

(k) Material directed into the beam in the vicinity of the work may comprise a combustible or explosive material operative to burn above the work or generate a controlled explosion for affecting the work such as generating a chemical reaction therewith, eroding or pulverizing part or all of the work, generating a larger explosion in the vicinity of or utilizing the work, generating a controlled nuclear reaction, etc.

Modifications and improvements to the apparatus and methods described are noted as follows:

In addition to the use of electron beam and laser radiation to attain certain of the results described above and here-after, other means for generating and utilizing high intensity radiation may also be employed. For example, high voltage and/or high amperage electrical energy may be controllably applied to one or more electrodes of one or more electrode pairs disposed as described,or otherwise proximate to each other and so energized as to generate a continuous and/or intermittent plasma in the space or volumes between electrode pairs upon the discharge of electrical energy therebetween. Solid, particulate, liquid of gaseous reaction material, or a plurality of different reaction materials in the same or different states, may be motor driven or flowed as a stream or streams between such electrodes or one or more tandem arrays of stream following electrode pairs to be intensely heated by the arc or plasma radiation in a manner to effect a change in physical state of the reaction material such as by vaporizing or melting same, or by chemically changing same by electropyrolosis and/or electrochemical reaction wherein two or more elements or compounds are caused to chemically react in the high temperature plasma or the bonds between the atoms of one or more compounds are broken. Such processes, include controllably separating the reaction products either during the processing of reaction material by one or more of the high temperature plasmas, so generated ,as matter is flowed therethrough or immediately after passing from such single or multiple plasmas. Such separation may be effected by known separation means such as by gravity, centrifuging, vortex flow, filtering, radiation beam or a combination of such means. In continuous processing, one or more of the products of a plasma reaction may be flowed or conveyed to the next stage of processing to partake in one or more further chemical physical reactions downstream of the plasma generating apparatus.

In a particular form of the invention, a gas, liquid, or particles of a solid or two or more solids per se or disposed in a liquid stream may be flowed by gravity or pumped through a duct containing a plurality of electrode pairs disposed at select spaced intervals along such duct, across each of which electrode pairs is generated one or more plasmas, such as a continuous or intermittent arc or series of intermittent and/or continuous arcs, through which plasma such reaction fluid is passed to effect heating of the molecules thereof to either break the bonds between one or more of the compounds of the fluid or its particles or to effect a select chemical reaction or reactions with respect to elements and/or compounds of the fluid passing through the duct. The duct, or elongated reaction chamber may be made of or lined with a suitable high temperature or chemical corrosion resistent material, such as Pyroceram or the like. In a particular form, all or a portion of such duct or reaction chamber may be rotated about its longitudinal axis or otherwise, to effect one or more results. If the duct is irregularly shaped and/or contains one or more vanes therein, a helical swirling movement may be imparted to the working fluid or products of reaction passing through the duct to centrifuge or otherwise separate atoms or molecules which are products of the high temperature reaction which takes place within the duct. If the electrode-pairs are located off center within the duct, the plasmas generated thereby will be rotated through the working fluid is it passes longitudinally through the duct to optimize the reaction results if the flow of such working fluid is controlled to effect such optimized reaction. In a particular form, such plasmas may be generated by locating the electrodes of the electrode pairs at or near opposite walls of the duct to permit the plasma generating arcs to span the width of the duct, thus permitting the plasmas to react on all fluid passing therebetween and filling the interior volume of the duct. The line or plane between pairs of such electrodes may be radially angulated with respect to the other pairs of electrodes so as to react on all or more of the fluid material passing though the elongated reaction chamber or duct.

Figure 8:
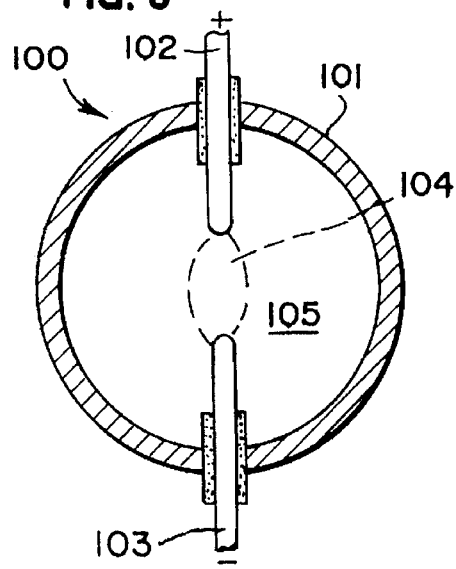
FIG. 8 is an end view with parts broken away for clarity of an elongated reaction chamber employing electrodes which project into the chamber.

In FIG. 8 is shown a radiation reaction apparatus 100 defined by an elongated cylindrical tube or duct 101 formed of a suitable metal, metal alloy, ceramic such as a ceremet or high temperature glass or a combination of such materials preferably with one covering or coating the other, such as a metal tube interiorally coated with a high temperature ceramic insulatedly supported by opposite wall portions of the duct 101 are respective electrodes 102 and 103 of an electrode pair which protrude into the interior volume 105 of the duct and terminate apart to define a gap or space 104 therebetween. Molecules of gas, vapor or solid or liquid particulate material or combinations thereof to be reacted on, are pumped, fed by gravity or otherwise flowed through duct 101 se or on a stream of neutral gas molecules such as nitrogen, past and between the electrodes while suitable electrical energy is applied across the electrodes to generate a high temperature arc or plasma therebetween. A single electrode pair or a plurality of electrode, pairs aligned with each other, may also be staggered along the duct and energized to generate respective arcs for progressively and/ or completely heating all or select fluid particles or molecules passed through the duct to temperatures sufficient to effect the described chemical and/or physical reactions. While the electrodes 102 and 103 of FIG. 8 are operable to generate an arc near the center of the duct, other electrode pairs downstream and/or upstream thereof may be space separated one or more distances closer to the wall of the duct on either or both sides of the axis of the aligned electrodes illustrated, either close to the electrodes illustrated and/or for some distance downstream or upstream thereof. If the duct is made of an electrically conducting material such as metal, the electrodes are preferably insulatedly supported thereon as shown by suitable insulating collars or deposited material. Depending on the voltage and the gaseous matter in the duct, the plasma arc may be generated in the gap 104 and/or in a volume extending laterially therefrom.

Longitudinally extending guides or vanes secured to or forming part of the wall 101 may be so shaped and disposed as to guide and cause working fluid passing longitudinally through the duct through the one or more plasmas generated therein as described.

Variations in the construction and operation of the apparatus 100 of FIG. 8 are noted as follows:

A. Electrode pairs of the type shown and/or modifications thereof may be supported by adjacent or opposite portions of the wall of the elongated reaction chamber or duct at a number of locations longitudinally along the duct. Such electrodes may be located and positioned with respect to each other and the flow volume 105 of the duct that substantially all of the gas molecules and/or soild particles passing through the duct pass through one or more plasmas generated within the duct and are heated to a suitable high temperature to effect a desired physical and/or chemical reaction to effect reactions of the types described herein involving, for example, the pyrolizing and reduction of waste gases and particles therein, to reducing of ores to remove a metal or metals therefrom, the removal or elements, such as carbon, from gases and soild particulate materials and the formation of synthetic diamond or other materials therefrom, the separation of hydrogen from oxygen in water vapor, the reduction of carbon monoxide from combustion gas to form carbon dioxide and/or elemental carbon and oxygen thereof, breaking the bonds between carbon and oxygen atoms of carbon dioxide to form carbon and oxygen thereof per se or in the present of a gaseous or particulate catalyst.

B. The apparatus 100 may comprise, form part of or be disposed longitudinnaly within a smokestack connected to a furnace or an exhaust pipe for an internal combustion engine.

C. Microwave, laser or other form of beamed energy may be generated outside the reaction chamber 101 and directed through one or more openings in the side wall thereof to scan and heat the fluid contents of the chamber per se or in combination with the heat generated by the electrically discharged electrode pair or pairs of electrodes disposed within the volume 105 at one or more locations therein as described.

D. Replacement of worn electrodes may be effected by an automatic handling means,such as an automatic manipulator service one or more reaction chambers. Alternatively, either or both electrodes may be power driven at a fixed rate or in accordance with signals generated by a sensing means sensing electrode wear or the distance between electrodes, by a motor or motors controlled by a microprocessor or computer. Each electrode or a bank or banks of longitudinally aligned or staggered electrodes may be secured to a common bus which is driven by a motor supported by the wall 101 of the duct, in a manner to maintain a constant or predetermined gap between all electrode pairs.

Figure 9:
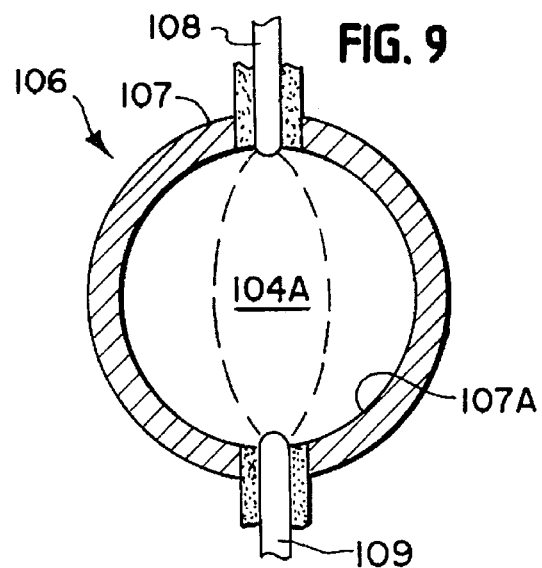
FIG. 9 is an end view with parts,broken away and sectioned for clarity of an elongated reaction chamber employing plasma generating electrodes which are space separated the width of the chamber.
Figure 10:
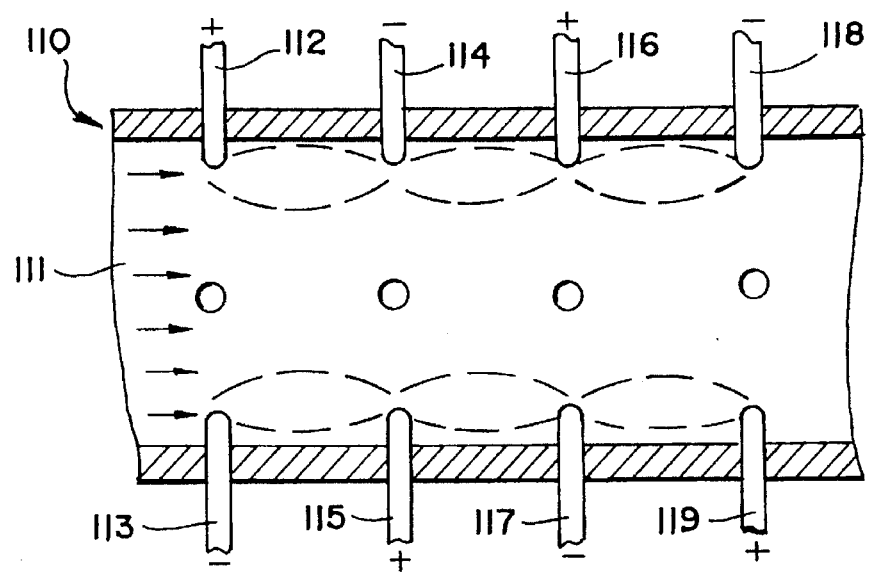
FIG. 10 is a side view in cross section of a modified elongated reaction chamber employing a plurality of electrode pairs to generate a plasma or plurality of plasmas in the chamber.
Figure 11:
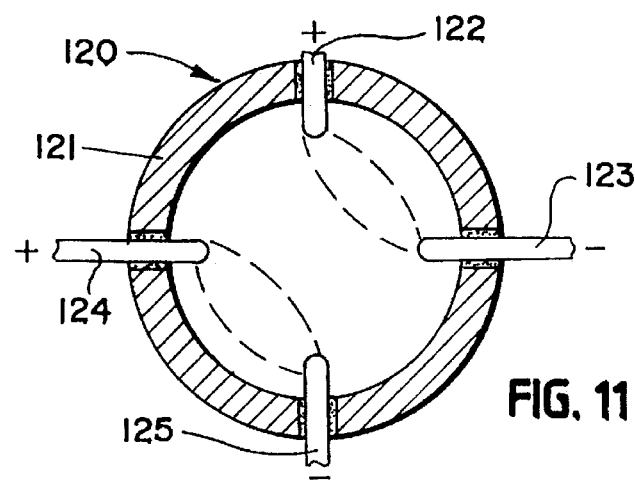
FIG. 11 is an end view in crossection of a modified elongated reaction chamber having adjacent electrodes for generating respective plasmas therebetween.

E. A single plasma may be generated between a plurality of electrode pairs longitudinally aligned or staggered longitudinally along the duct or separate and discrete plasmas may be so generated which are of the same intensity or predetermined intensities depending on the manner in which heating or pyrolizing material in the duct is effected. For example, a plurality of plasmas may be generated along the duct operable to gradually or step increase the temperature of particles or gas molecules flowing through the duct from plasma to plasma. Plasmas may be generated completely across the diameter of the volume 105 and/or longitudinally therein by means such as illustrated in FIGS. 9, 10 and 11 or modifications thereof.

F. The radially extending electrodes 102 and 102 may be supplemented or replaced with electrodes or electrode assemblies which extend longitudinally though and within the duct 101. Electrodes may also be formed of electrically conducting material or materials such as carbon, metal, metal alloys, superconducting material or combinations thereof which partially coat or line the inside surface of the duct 101. The duct may also be fabricated of a plurality of longitudinally extending wall sections of conducting electrode material which are insulated from each other by respective wall section made of insulating material such as high temperature ceramic or glass material. Thus adjacent or opposite sections of the duct wall made of conducting material such as graphite or carbon metal, metal alloy or superconducting material or a combination thereof may be oppositely charged to provide plasma arcing therebetween for the purposes described.

G. A single computer supported exterior of the duct 101, may be employed to control all process variables including the feeding and flow of one or more reaction fluids to one end of the duct, current applied continuously or intermittently to the electrodes to generate continuous or intermittent plasmas therebetween, electrode replenishment, etc.

Further modifications to the apparatus and methods described are noted as follows:

Where atoms of products of the described high temperature heating of gas or particulate matter are separated from the molecules thereof,they may be continuously combined with other atoms or molecules of additional matter continuously fed to the reaction chamber, zone or zones or may be absorbed by solid particles of matter so delivered. For suitably dissipating waste particles and gas molecules of combustion, particles of one or more low cost materials such as calcium carbonate, calcium chloride, or other material may be fed to the reaction chamber or zone separate from or mixed with the waste gas and particles to react on or absorb the components of reaction resulting from the described high temperature heating. Such additional particulate material may be employed to absorb and/or react with the products of the high temperature reaction to reduce same disposable solid waste or provide one or more new and useful products thereof.

Liquids or liquids containing solid particulate material and/or solid chemicals dissolved therein may be flowed through reaction apparatus of the types illustrated in FIGS. 8 to 11 whereby arc generated between the electrode pairs thereof heat and effect reactions of the types described with respect to the molecules of the liquid and/or particles of solid matter thereon. In addition to various chemical reactions, hydrogen atoms may be so separated from oxygen atoms of water generating bubbles of hydrogen and oxygen gas mixture in the water passed through the reaction chamber or duct which bubbles may be collect-downstream by know means, Such mixtures may be stored or burned or otherwise used in further reactions or may have the hydrogen and oxygen components thereof separated from each other for various separate uses. In a particular form, all or substantially all of the liquid passed into one end of the reaction duct may be reduced to its atomic components or otherwise caused to undergo a complete chemical reaction.

In FIG. 9 a high temperature reaction apparatus 106 includes an elongated duct or tube 107 of the type described having one or more pairs of electrodes 108 and 109 supported by opposite portions of the wall or walls of the duct. The inner ends 108A and 109A of the electrodes 108 and 109 terminate at or near the inside surface of the tube-or duct 107 which may be constructed as described. Thus the arc A is generated as shown and extends substantially completely across the center of the interior volume 110 of the duct 107. The construction of the duct and electrode mounting may be in accordance with the teachings of FIG. 8. A plurality of pair of such electrodes may be supported aligned along the duct, staggered or helically disposed therealong to heat and effect reactions with respect to a select amount or substantially all the particles or molecules of fluid material passed through the duct. The arcs may be generated as a single plasma or plurality of separated plasmas continuously and/or intermittently. In the latter mode of operation, all arcs may be generated simultaneously or in a select or predetermined sequence along the duct to optimize the reaction or reactions taking place within the duct. Feedback signals generated by one or more sensors sensing such reaction variables as current voltages, amperages, plasma temperatures and shape, reaction products,etc may be employed in a closed loop process control system to control such variables as flow rate, composition, voltage and amperage. Products of reaction such as atoms and molecules of gas, vapor and/or solid material(s) may be collected downstream of the reaction zone or zones and separated or used as described.

While FIG. 10 may represent a side view of the apparatus of FIG. 9 when multiple pairs of electrodes are employed, if adjacent electrodes on the same side of the wall are of opposite polarity, plasma arcs may be generated therebetween as shown rather than across the center of the duct as in FIG. 9. A combination of arcs generated close to the wall, as in FIG. 10 and across the duct as in FIG. 9 may also be employed in yet another embodiment of the invention.

In FIG. 11 is shown a modified form of the invention illustrated in FIGS. 8 to 10 the features of which may be combined with features of the other figures or employed per se. The reactor 120, as in the construction of the other reactors, may comprise an elongated cylindrical duct or chamber or a spherical or otherwise shaped chamber through which reaction fluid is continuously force flowed by pump, blower, gravity or a combination thereof. Supported by the side wall of the chamber 121 and protruding into the volume interior thereof are a plurality of electrodes. Four electrodes 122, 123, 124 and 125 are shown defining two pairs of electrodes disposed near opposite sides of the chamber. Electrodes 122 and 123 which are located laterally adjacent each other define one electrode pair across or between which a first plasma P1 is genera generated when suitable electrical potential is applied to the positive electrode 122 and breaks down or discharges in the gap at the end thereof to the end of the negative electrode 123. The other electrode pair is composed of electrodes 124 and 125 between which a second plasma is generated when the positive electrode is energized with suitable electrical energy. It is noted that additional pairs of electrodes of the type provided in FIG. 11 may be located laterally between those shown and/or longitudinally down the duct at respective locations to provide either a unitary plasma, a plurality of plasmas between two or more adjacent electrode pairs or a plurality of discrete spaced apart plasmas as require to effect desired reaction results.

Energy required to generate plasma arcs across the electrode pairs described may be derived from suitable sources of hydroelectric or otherwise generated electrical energy. Arrays of solar-to-electrical energy generating cells or focused solar energy to electrical energy generating means may also be employed to generate the required electrical energy for energizing the electrodes after such energy is boosted or increase to a proper volatge and amperage by suitable electrical equipment.

In a particular form of the apparatus and method described immediately above, a chemical composition or ore containing one or more elements, such as metal to be separated from the composition or ore, may be comminuted by known means or otherwise provided in flowable paticulate form and flowed per se to and through one or more high temperature plasmas generated between one or more electrode pairs by the application of suitable electrical energy therebetween and the high temperature of the plasma applied to heat the composition or ore to a temperature sufficient to break the bonds between atoms of metal or other element of the molecules of the composition or ore whereby such metal or other element becomes separated from the remaining elements of the compound or ore. Such separated materials may be collected in respective reservoirs or flow streams thereof by gravity, centrifuging or other known separating means and separately stored for use or used in a continuous process. Metal so separated may be in a molten state or further heated to become molten and alloyed, atomized or fed directly to a forming means such as a mold, continuous casting die or substrate where it may be solidified to a select shape or shapes. The method may define a continuous process for separating metal or metals directly from ore and shaping same in one or more stages. From a continuous casting die or mold, for example, the metal so refined and formed may be continuously fed to a rolling means such as a rolling mill for reducing and shaping same to plate, sheet, wire, rod or tubing. If atomized as described immediately after separation from the compound or ore, the metal may be sprayed against a shaping surface such as the surface of a mold, rolls of a rolling mill, elongated driven member such as a continuously formed or coil fed sheet, strip, rod, tube or other shape and solidified as a layer or coating thereon as the substrate is driven past the atomizing means.

In modified forms of the embodiments of FIGS. 8 to 11, suitable vanes or the like may be attached to the inside surface of the tubes or ducts illustrated to impart a helical or swirling movement to the fluid passed through the ducts to assure that substantially all the molecules or particles thereof pass through a plasma or arc or arcs generated along the duct. Furthermore, the tube or duct may also be rotated to pass the plasma arcs generated therein through most or a select quantity of the reaction fluid as it is flowed longitudinally through the duct.

It is also noted that one or more beams of the one or more described radiations (laser, electron beam, microwave, etc. radiation) may be passed longitudinally and/or laterally through the duct to react on fluid particles or molecules therein to effect the results described, per se or in combination with each other and/or one or more plasma arcs generated as described. Reactions which may be effected include (a) high temperature reactions on a gas or gases, vapor or vapors and/or particles of the same or different materials passed longitudinally through the duct to form new compositions; (b) high temperature or plasma reaction on gas or vapor molecules to separate select atoms therefrom such as atoms of carbon from methane gas which may be deposited onto a moving substrate within or beyond the end of the duct to form synthetic diamond coating on such substrate or may form particles of synthetic diamond within and/or beyond the open end of the duct; (c) high temperature reaction on particles of ore in a manner to separate metal and/or other atoms and the deposition thereof onto a moving substrate located within or beyond the end of the duct or reaction chamber; (d) high temperature reaction on molecules and/or particles of waste products such as the particles and gases of combustion in a furnace or reaction chamber such as an incinerator; (e) high temperature reaction with respect to carbon monoxide and/or carbon dioxide formed in a combustion or incineration process to separate carbon atoms from oxygen atoms thereof and to deposit the carbon atoms per se or as diamond particles or film on a moving substrate beyond the open end of the duct.; (f) high temperature reactions on process or combustion products where non-combustion matter such as particles of solid or liquid reactants or absorbant material are introduced into the duct at one or more locations thereof to partake in or absorb one or more of the products of reaction.

If the ducts of FIGS. 8 to 11 are of large diameter, such as in the configurations of smokestacks of an industrial process or furnace, beamed radiation may be generated as described and directed in one or more fixed paths longitudinally to intersect, heat and react on particles and/or molecules of the fluid reaction material passing therethrough. One or more laser or electron beams may also be generated and directed against a nuclear fuel, such as separately fed particles of trittium-deuterium passed into one or more select locations of the duct or stack, to thermonuclearly ignite same and generate, intermittent thermonuclear reactions for heating reaction material passing longitudinally through the duct or stack and incinerating or reacting on same as described herein.

Modified forms of the invention involving apparatus and methods as described above may involve the high temperature separation of carbon atoms from oxygen atoms of gas molecules of combustion waste gases produced in the operation of furnaces, internal combustion engines and chemical reactors. Such carbon and oxygen atoms may, be separated and collected in separate containers of useful byproducts or used downstream of the described high temperature reaction zone or zones in a continuing process or processes.

Where the described process is employed to separate metal from its ore by breaking the bonds between atoms of metal and atoms of other elements in the ore, continuous known means may be operated to comminute ore or chemicals into particles of same of small enough size to permit the continuous feeding and high temperature processing of same into desired molten or particulate metal which may be separated by known means from the other products of the high temperature reaction.

Beam radiation generated by an electron gun or laser as described herein may also be employed per se or in combination with one or more electrically discharged electrode pairs to generate or enhance one or more plasmas or plasma arcs for effecting high temperature chemical and/or physical reactions with respect to gaseous, vaporous and/or particulate material or a combination of materials which are fluidically mixed and fed as a stream to the reaction zone or zones defined by such plasma or plasmas or are fed on separate streams thereof to such zone or zones. A single radiation beam or a plurality of such beams may be magnetically or optically split into a plurality of beams which are directed along separate paths and are employed to either generate or enhance a plasma generated between electrodes or by other means. Fluidic gaseous or particulate solid or liquid matter may be stream directed through such plasma or aligned series of plasmas to heat the molecules thereof to high temperatures at which they react or the atoms thereof separate when the molecular bonds are broken or shattered by the high temperature. For example, various ores containing metal or metals, when subjected to temperatures in the range of 1700 degrees centigrade will have their metal atoms separated from the molecules containing same and such metal may be collected by gravity, centrifugal separation, filtration, magnetic means or a combination thereof, in a continuous formation and separation process. A single radiation beam, such as a laser or electron beam generated as described, may be passed between a plurality of electrode pairs properly aligned to permit matter to be reacted on to pass therethrough and be reacted on by the radiation of the plasma and the radiation beam applied thereto to effect controlled chemical and physical reactions as described. The pressure or force of the radiation beam may be employed to separate/select particles of reaction material, molecules or atoms thereof, from other gaseous or particulate matter by force flowing same along a path or paths to effect such separation. Select atoms of the reaction material may react to/a select wavelength or wavelengths or frequency of the radiation beamed to the reaction zone or zones while other atoms or molecules of matter resulting from the high temperature reaction may be subjected to radiation force sufficiently different therefrom to effect radiation separation of the products of the reaction by generating and separately directing the flows of different molecules and/or atoms of matter to different locations within and/or exterior of the reaction zone or chamber with laser beams of different wave lengths.

Beamed radiation, such as microwave radiation, may also be employed per se or in combination with laser and/or electron gun generated beam radiation, one or more electrode pair generated plasmas or the like, to effect the chemical and/or physical reaction or reactions described. For example, such microwave radiation may be generated and focused as a beam to a reaction zone defined by one or more pairs,of electrode between which is discharged high voltage and/or high amperage electrical energy as a continuous or intermittent discharge to generate a continuous or intermittent plasma. Such microwave radiation may also be directed and focused through a plurality of plasmas generated as described by a plurality of electrically discharged electrode pairs disposed close to each other or in a line along the path of flow of working fluid or fluids.

The arrangements and methods described above may also be employed to selectively deposit a material or materials on to a stationary or moving substrate for coating, implanting and/or separating same from matter such as ore particles, chemical compositions or the like as described. Particles or atoms which are not so deposited onto such a moving substrate, which may comprise a wire, rod, tube, sheet or strip which is continuously formed and driven, supplied from a coil or other source or otherwise conveyed past the reaction material, may flow by gravity away from the moving member. Atoms or particles so formed or separated by high temperature radiation may be employed to coat the moving substrate as a permanent coating or removed therefrom downstream of the coating location and collected.

What is claimed is:

1. A method for effecting a reaction in a reaction chamber comprising:

(a) feeding a plurality of reaction materials into a reaction chamber, including water;
   (b) generating a high temperature plasma within said reaction chamber, said plasma causing a reaction of dissociating said water into products comprising hydrogen and oxygen atoms; and
   (c) removing the products of the reaction from said reaction chamber;
   wherein said feeding and generating of said temperature are effected under computer control.

2. A method in accordance with claim 1 further comprising the step of using one or more of said reaction products to fuel the plasma.

3. A method in accordance with claim 2 wherein the step of generating includes the step of burning said hydrogen atoms.

4. A method in accordance with claim 1 wherein the high temperature plasma is generated between electrodes.

5. A method in accordance with claim 4 further comprising the step of generating an electrical potential across said electrodes, which is controllably varied in voltage under the control of said computer.

6. A method in accordance with claim 1 further comprising using a radiation beam to heat said plurality of materials in said chamber.

* * * * *

Disclaimer

5,628,881 — Jerome Lemelson, Incline Village, Nev. HIGH TEMPERATURE REACTION METHOD. Patent dated May 13, 1997. Disclaimer filed May 05, 2004, by the inventor, Jerome Lemelson.

Hereby declaim the terminal sixty (60) months of the above referenced patent.

*(Official Gazette May 24, 2005)*